(12) United States Patent
Lee et al.

(10) Patent No.: US 9,197,265 B2
(45) Date of Patent: *Nov. 24, 2015

(54) RECEIVING DEVICE AND METHOD FOR REMOVING MISMATCH IN WIRELESS COMMUNICATION SYSTEM, AND LOW-POWER AMPLIFIER THEREOF

(71) Applicants: Samsung Electronics Co., Ltd., Suwon-si, Gyeonggi-do (KR); INDUSTRY-UNIVERSITY COOPERATION FOUNDATION KOREA AEROSPACE UNIVERSITY, Goyang-si, Gyeonggi-do (KR)

(72) Inventors: Hee-Hyun Lee, Hwaseong-si (KR); Young-Jin Kim, Goyang-si (KR); Young-Min Ki, Suwon-si (KR)

(73) Assignees: Samsung Electronics Co., Ltd., Suwon-si (KR); Industry-University Cooperation Foundation Korea Aerospace University, Goyang-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/537,257

(22) Filed: Nov. 10, 2014

(65) Prior Publication Data

US 2015/0065075 A1    Mar. 5, 2015

Related U.S. Application Data

(63) Continuation of application No. 13/816,890, filed as application No. PCT/KR2011/005908 on Aug. 11, 2011, now Pat. No. 8,886,151.

(30) Foreign Application Priority Data

Aug. 13, 2010  (KR) ................. 10-2010-0078395

(51) Int. Cl.
 | | |
 |---|---|
 | *H03F 3/45* | (2006.01) |
 | *H04B 1/10* | (2006.01) |
 | *H04B 1/18* | (2006.01) |

(52) U.S. Cl.
CPC .............. *H04B 1/10* (2013.01); *H03F 3/45188* (2013.01); *H03F 2200/294* (2013.01); *H03F 2203/45386* (2013.01); *H03F 2203/45644* (2013.01); *H04B 1/18* (2013.01)

(58) Field of Classification Search
USPC ................ 455/232.1, 234.1, 250.1, 296, 341, 455/343.1
See application file for complete search history.

(56) References Cited

U.S. PATENT DOCUMENTS

| | | |
|---|---|---|
| 4,871,978 A | 10/1989 | Galbraith |
| 4,887,047 A | 12/1989 | Somerville |

(Continued)

FOREIGN PATENT DOCUMENTS

| | | |
|---|---|---|
| JP | 2010068165 A | 3/2010 |
| KR | 10-2008-0048591 A | 6/2008 |

(Continued)

*Primary Examiner* — Blane J Jackson
(74) *Attorney, Agent, or Firm* — Jefferson IP Law, LLP

(57) ABSTRACT

The present invention relates to a receiving device and method for removing a mismatch in a wireless communication system, and to a low noise amplifier (LNA) therefor. According to the present invention, the receiving method for removing the mismatch comprises the steps of: distinguishing the type of input signal received through a wireless network; controlling such that a common bias is applied to transistors within a low noise amplifier, if said input signal is a wideband signal; and outputting a signal from which said mismatch has been removed, by using a current mirror mode in which current paths within said low noise amplifier are crossed.

15 Claims, 7 Drawing Sheets

(56) References Cited

U.S. PATENT DOCUMENTS

| | | |
|---|---|---|
| 5,113,147 A | 5/1992 | Klein |
| 6,049,246 A | 4/2000 | Kozisek et al. |
| 6,573,783 B2 | 6/2003 | Gray |
| 7,095,281 B2 | 8/2006 | Zipper et al. |
| 2008/0122538 A1 | 5/2008 | Park et al. |
| 2009/0102562 A1 | 4/2009 | Chang et al. |
| 2009/0153244 A1 | 6/2009 | Cabanillas et al. |
| 2010/0148849 A1 | 6/2010 | Lee et al. |

FOREIGN PATENT DOCUMENTS

| | | |
|---|---|---|
| KR | 10-2008-0052226 A | 6/2008 |
| KR | 10-2010-0069383 A | 6/2010 |

RECEIVING DEVICE AND METHOD FOR REMOVING MISMATCH IN WIRELESS COMMUNICATION SYSTEM, AND LOW-POWER AMPLIFIER THEREOF

CROSS-REFERENCE TO RELATED APPLICATION(S)

This application is a continuation of U.S. application Ser. No. 13/816,890, filed Feb. 13, 2013, which was the National Stage of International Application No. PCT/KR2011/005908, filed Aug. 11, 2011, and under 35 U.S.C. §119(a) of a Korean patent application filed on Aug. 13, 2010 in the Korean Intellectual Property Office and assigned Serial number 10-2010-0078395, the entire disclosures of each of which are hereby incorporated by reference.

TECHNICAL FIELD

The present invention relates to an interference cancellation device and method in a wireless communication system, and more particularly, to a receiving device and method for removing a mismatch in a wireless communication system, and a Low Noise Amplifier (LNA) thereof.

BACKGROUND ART

In a Frequency Division Duplex (FDD) application field, a general wireless communication system intensively outputs a signal of a transmitter of a wireless terminal in a weak electric field of a receiver in the wireless terminal (hereinafter, a wireless receiver or a receiver), for controlling power. Therefore, the receiver is vulnerable to interference by the transmitter in the weak electric field and thus, may use an external Radio Frequency Filter (RF filter) such as a Surface Acoustic Wave Filter (SAW Filter), as a separate component element, to remove the interference.

There may be various factors that cause the interference. In the specifications, a scheme of removing a mismatch which is one of the factors that cause interference in the wireless communication system will be described. Conventionally, as a scheme of removing a mismatch, a scheme of including an auxiliary circuit in a signal amplifying path identical to a signal amplifying path of a main amplifier so as to remove a mismatch, a scheme in which an output end of a receiver feeds a current voltage back to an input/output intermediate tap so as to partially correct a mismatch, and the like have been proposed.

However, the conventional method employs a circuit structure that removes a mismatch in the output end of the receiver and thus, there is difficulty in removing a mismatch of an input signal itself in an input end or a mismatch due to a low noise amplifier (LNA).

In the conventional method, the receiver operates each auxiliary path amplifier formed of an independent bias based on a scheme in which the input signal is cross-coupled in two signal paths. The cross-coupling of the input signal increases a gain, and removes a $3^{rd}$ harmonic component by adjusting a bias of an auxiliary path and the like.

However, to receive a narrowband signal such as a 2G signal and a wideband signal such as a 3G signal through the same path, a high level of IIP2 (second-order input intercept point) performance is required. The IIP2 is a parameter indicating a linearity of a circuit. In general, a received signal may be distorted by interference between channels having a small frequency difference or mutual interference between signals in a signal band. The IIP2 is defined to indicate a linearity of a circuit based on a relationship between an amount of distortion by a secondary intermodulation (IM2) and an amount of amplified input frequency from among factors causing distortion of a received signal.

Specifically, when power of an input signal is continuously increased in a receiver, power of an IM2 distorted signal increases with a sharp inclination. A power point, where the input signal and the IM2 distorted signal are expected to cross, viewed from an input end of the receiver is defined to be the IIP2. Therefore, the IIP2 is required to be high to secure a high linearity in the wireless communication system, which indicates that the IM2 distortion is minimized.

Therefore, the receiver in the wireless communication system is required to be designed to have a high IIP2 parameter value.

A decrease in the IIP2 parameter value may occur due to the following four mismatch cases.
1. a mismatch of an input signal itself (mostly external component filter (for example, SAW filter), PCB line, Packaging Effect, Bonding inductor, etc).
2. a mismatch of a low noise amplifier (LNA) circuit itself in an input end
3. a mismatch of a mixer circuit itself and a Local Oscillation (LO) signal
4. a mismatch of a Trans-Impedance Amplifier (TIA) itself The mismatches of the item 1 and the item 2, that is, the mismatch of an input signal itself and the mismatch of a low noise amplifier itself in an input end, may be amplified by a low noise amplifier and the amplified mismatch may be partially decreased through an IIP2 calibration circuit connected to a back end of the low noise amplifier in the receiver. However, the decrease is limited.

Another conventional method of decreasing a mismatch occurring in the input end of the receiver adjusts a direct current at an intermediate point between the input end and the output end by monitoring a current voltage at the output end. However, the method has a limitation in decreasing a mismatch using only a direct current bias.

Also, transmission of a wideband signal (for example, a signal of a 3G or 4G network) for high-speed packet data service and the like has been dramatically increased. However, when interference cancellation, such as removal of a mismatch, is identically performed with respect to the wideband signal and a narrowband signal (for example, a signal of 2G network) for a voice service and the like, effective interference cancellation performance may not be secured.

DETAILED DESCRIPTION OF THE INVENTION

Technical Problem

Therefore, the present invention has been made in view of the above-mentioned problems, and an aspect of the present invention is to provide a receiving device and method that effectively removes a mismatch in a wireless communication system.

Another aspect of the present invention is to provide a receiving device and method that removes a mismatch based on a type of an input signal in a wireless communication system.

Another aspect of the present invention is to provide a low power amplifier that effectively removes a mismatch in a wireless communication system.

Technical Solution

In accordance with another aspect of the present invention, there is provided a receiving method that removes a mismatch in a wireless communication system, the method including: determining a type of an input signal received through a wireless network; performing controlling so that a common bias is applied to transistors in a low noise amplifier when the input signal corresponds to a wideband signal; and outputting a signal from which a mismatch is removed using a current mirror scheme in which current paths in the LNA cross.

In accordance with another aspect of the present invention, there is provided a receiving device for removing a mismatch in a wireless communication system, the method including: a low noise amplifier to amplify an input signal received through a wireless network based on a current mirror scheme in which current paths cross; and a controller to determine a type of the input signal, and to perform controlling so that a common bias is applied to transistors in the low noise amplifier and a signal from which a mismatch is removed is output when the input signal corresponds to a wideband signal.

In accordance with another aspect of the present invention, there is provided a low noise amplifier included in a receiver of a wireless communication system, the low noise amplifier including: a plus amplifying unit to receive a plus input signal in the receiver and to amplify the received plus input signal; and a minus amplifying unit to receive a minus input signal in the receiver and to amplify the received minus input signal, and the plus amplifying unit and the minus amplifying unit form a current mirror in which current paths cross.

Advantageous Effects

According to an embodiment of the present invention, a low noise amplifier that may remove a mismatch in an input end of a receiver that receives a wireless signal is provided, and a mismatch of a wireless signal may be effectively decreased without using an external radio frequency filter (RF Filter) such as a surface acoustic wave filter (SAW Filter).

Also, according to an embodiment of the present invention, a receiver commonly processes a wideband signal and a narrowband signal through a single path and thus, a complexity of the receiver is decreased and a required chip area is minimized.

Also, according to an embodiment of the present invention, when a wideband signal and a narrowband signal are distinctively processed, IIP2 performance may be improved by minimizing a mismatch in a case of the wideband signal and IIP3 performance may be improved by increasing linearity in a case of the narrowband signal.

MODE FOR CARRYING OUT THE INVENTION

Hereinafter, various embodiments of the present invention will be described with reference to the accompanying drawings. In the following description of the present invention, a detailed description of known functions and configurations incorporated herein will be omitted when it may make the subject matter of the present invention rather unclear.

Embodiments of the present invention provide a configuration of a receiver that may effectively decrease a mismatch of a wireless signal without using an external radio frequency filter (RF Filter) such as a surface acoustic wave filter (SAW Filter), and a circuit structure of a low noise amplifier included in the receiver.

Figure 1:
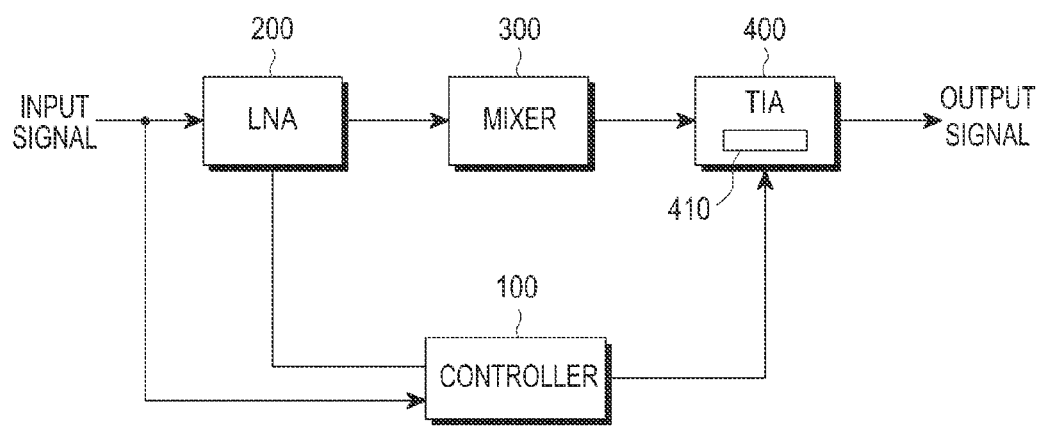
FIG. 1 is a block diagram illustrating a configuration of a receiver that removes a mismatch according to an embodiment of the present invention.

FIG. 1 is a block diagram illustrating a configuration of a receiver that removes a mismatch according to an embodiment of the present invention.

The receiver of FIG. 1 includes a low noise amplifier (LNA) 200 to amplify an input wireless signal by restraining noise of the wireless signal, a mixer 300 to perform frequency down-converting on the amplified wireless signal output from the low noise amplifier 200 into a baseband signal, and a trans-impedance amplifier (TIA) 400 to convert the baseband signal output from the mixer 300, that is a current signal of a baseband, into a voltage signal. The trans-impedance amplifier 400 includes an IIP2 compensator 410 to perform IIP2 compensation of the voltage signal of the baseband to provide a high IIP2 performance.

The trans-impedance amplifier 400 of FIG. 1 converts a trans-conductance (Gm) signal generated from the mixer 300 into a voltage signal and amplifies the voltage signal, and performs filtering on a portion of an adjacent channel interference signal. A feedback resistance value in the trans-impedance amplifier 400 varies through the IIP2 compensator 410 and thus, a high IIP2 performance may be obtained. An overall gain of the receiver of FIG. 1 may be represented by a function of the trans-conductance (Gm) generated from the low noise amplifier 200 and the mixer 300 and the feedback resistance value (R) in the trans-impedance amplifier 400. That is, overall gain (Gain)=GmxR. The high IIP2 performance provided in an embodiment of the present invention may be obtained by decreasing a differential mismatch in the low noise amplifier 200, and a mismatch occurring in the mixer 300 and the trans-impedance amplifier 400 may be decreased by performing compensation of the feedback resistance value in the IIP2 compensator 410.

A controller 100 in FIG. 1 controls general operations of the low noise amplifier (LNA) 200, the trans-impedance amplifier (TIA) 400, and the IIP2 compensator 410, so as to remove a mismatch in both an input end (that is, the low noise amplifier 200) and an output end (that is, the trans-impedance amplifier 400) of the receiver. The mixer 300, the trans-impedance amplifier 400, and the IIP2 compensator 410 in FIG. 1 use a publically known configuration and thus, the removal of the mismatch according to an embodiment of the present invention will be described based on the low noise amplifier 200.

The low noise amplifier 200 according to an embodiment of the present invention removes a mismatch in the input end of the receiver. The low noise amplifier 200 commonly receives and processes a wideband signal such as a 3G signal and a narrowband signal such as a 2G signal in a single signal path, without using a separate wireless component such as an external radio frequency filter (RF Filter).

Hereinafter, the low noise amplifier 200 in FIG. 2 will be described using an LNA having two differential pairs of a common source structure as an example, but the low noise amplifier 200 may not be limited to the common source structure.

Figure 2:
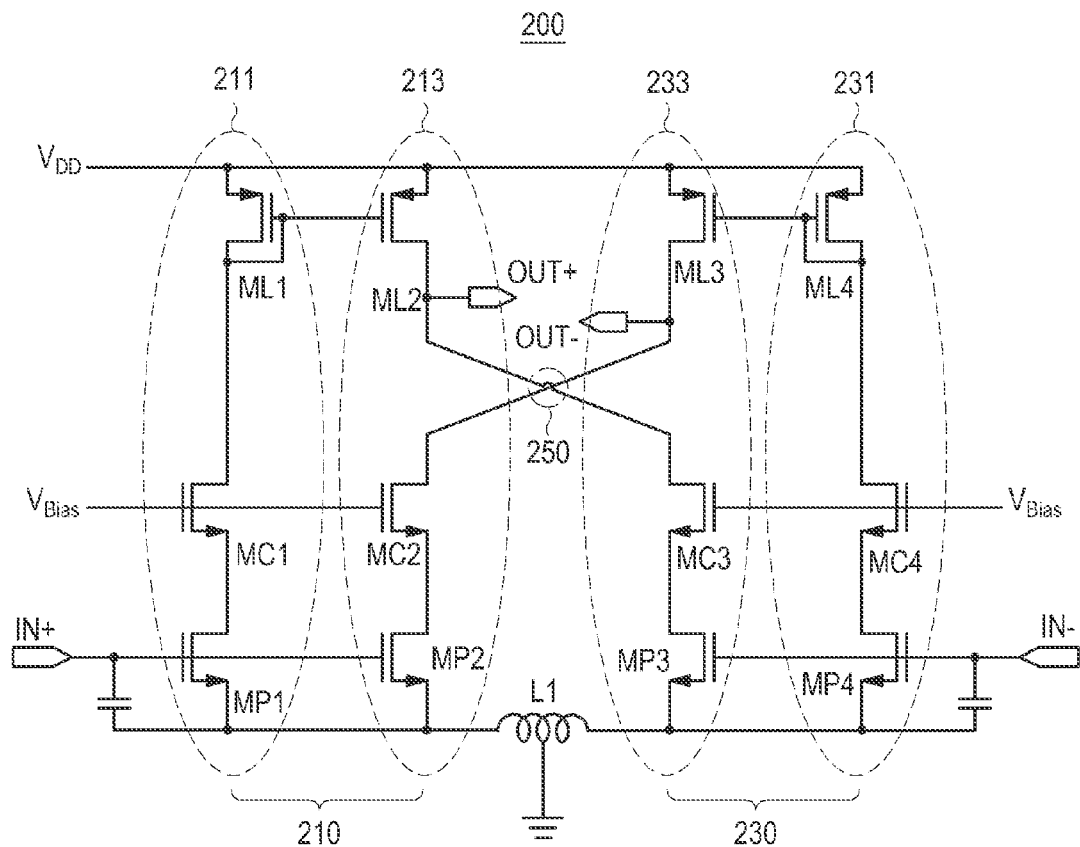
FIG. 2 is a circuit diagram illustrating a circuit structure of a low noise amplifier of FIG. 1.

FIG. 2 is a circuit diagram illustrating a circuit structure of the low noise amplifier of FIG. 1.

FIG. 2 illustrates an example of the low noise amplifier 200 formed of two sets of differential pair amplifiers (Differential pair Amp) having a common source degeneration inductor structure for main amplification of an input signal.

In FIG. 2, the two differential pair amplifiers (211 and 213, and 231 and 233) may be separated into an identical form, and may process a plus input signal and a minus input signal, respectively. In FIG. 2, the diagrams 211 and 213 correspond to first and second plus amplifying units, and the diagrams 231 and 233 correspond to first and second minus amplifying units. In FIG. 2, IN+ and IN− denote input ends to which a signal of an I channel and a signal of a Q channel forming a wireless signal are input, respectively. OUT+ and OUT− denote output ends from which a signal of an I channel and a signal of a Q channel are amplified and output, respectively. In the configuration of the receiver of FIG. 1, only a signal path is illustrated for ease of description.

A first plus amplifying unit 211 includes a PMOS (ML1), an NMOS (MCI), and an NMOS (MP1) which are sequentially connected in series. A source of the PMOS (ML1) is connected to a power supply (VDD), a drain of the PMOS (ML1) is connected to a drain of the NMOS (MC1), a source of the NMOS (MC1) is connected to a drain of the NMOS (MP1), and a source of the NMOS (MP1) is grounded by an inductor (L1). A gate of the NMOS (MP1) is connected to the input end (IN+). In FIG. 2, the first minus amplifying unit 231 includes a PMOS (ML4), an NMOS (MC4), and an NMOS (MP4), which are sequentially connected in series. A source of the PMOS (ML4) is connected to the power supply (VDD), a drain of the PMOS (ML4) is connected to a drain of the NMOS (MC4), and a source of the NMOS (MC4) is connected to a drain of the NMOS (MP4), and a source of the NMOS (MP4) is grounded by the inductor (L1).

According to an embodiment of the present invention, the second plus amplifying unit 213 of FIG. 2 is cross-coupled with the second minus amplifying unit 233. A drain of a PMOS (ML2) of which a source is connected to the power supply (VDD) in the second plus amplifying unit 213 is connected to the output end (OUT+) and a drain of an NMOS (MC3) to which a bias ($V_{Bias}$) is applied in the second minus amplifying unit 233. A drain of a PMOS (ML3) of which a source is connected to the power supply (VDD) in the second minus amplifying unit 233 is connected to the output end (OUT−) and a drain of an NMOS (MC2) to which a bias ($V_{Bias}$) is applied in the second minus amplifying unit 233.

A drain of an NMOS (MP2) of which a source is grounded is connected to a source of the NMOS (MC2) to which the bias ($V_{Bias}$) is applied in the second plus amplifying unit 213, and a drain of an NMOS (MP3) of which a source is grounded is connected to a source of the NMOS (MC3) to which the bias ($V_{Bias}$) is applied in the second minus amplifying unit 233.

Two PMOSs (ML1 and ML2) form a PMOS load in the first and second plus amplifying units 211 and 213 of FIG. 2, and two PMOSs (ML3 and ML4) form a PMOS load in the first and second minus amplifying units 231 and 233.

The NMOSs (MC1, MC2, MC3, and MC4) having gates to which a common bias ($V_{Bias}$) is applied may use, for example, an MOS FET provided in a cascode structure having a current buffer form, and NMOSs (MP1, MP2, MP3, and MP4) of which gates are connected to the input end (IN+ and IN−) may use, for example, an Metal Oxide Semiconductor Field-Effect Transistor (MOS FET) provided in a common source structure.

It is described that the low noise amplifier 200 having the circuit structure is configured using the MOS FET, but the low noise amplifier 200 may be configured using various types of substitutive transistors in addition to the MOS FET.

Hereinafter, for ease of description, the first and second plus amplifying units 211 and 213 are referred to as a plus amplifying unit 210, and the first and second minus amplifying units 231 and 233 are referred to as a minus amplifying unit 230.

A mismatch occurring from a circuit itself of the low noise amplifier 200 may be removed by maintaining a direct current (DC current) to be regular in the plus amplifying unit 210 and the minus amplifying unit 230. Although a bias current in the plus amplifying unit 210 and the minus amplifying unit 230 may be designed to be identical when the amplifier is initially designed, a mismatch may occur in a current path of the bias current due to a fine error in a threshold voltage generated during a transistor manufacturing process or an ambient environment of a device such as a circuit layout.

The low noise amplifier 200 in the embodiments of the present invention is configured in which current paths of the plus amplifying unit 210 and the minus amplifying unit 230 cross as shown in the diagram 250. Therefore, an amount of current flowing through a path of the first plus amplifying unit 211 and an amount of current flowing through a path of the second minus amplifying unit 233 are equal based on a principle of a current mirror of FIG. 3. In the same manner, an amount of current flowing through a path of the second plus amplifying unit 213 and an amount of current flowing through a path of the first minus amplifying unit 231 are equal based on the principle of the current mirror. Therefore, an identical bias current is maintained in the first plus amplifying unit 211 and the second minus amplifying unit 233, and also, an identical bias current is maintained in the second plus amplifying unit 213 and the first minus amplifying unit 231.

Figure 3:
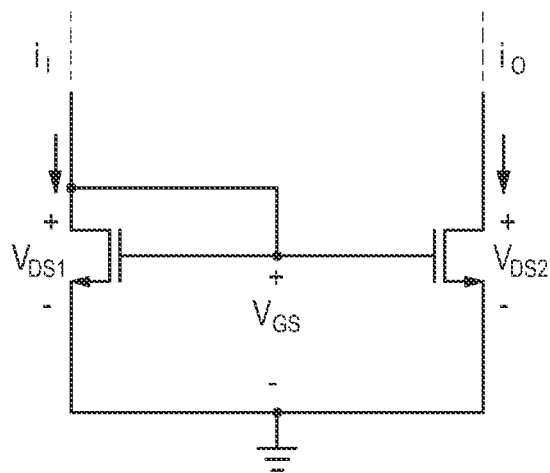
FIG. 3 is a diagram illustrating an operation of a current mirror.

FIG. 3 is a diagram illustrating a characteristic of a current mirror to help understanding of the embodiments of the present invention.

A predetermined current condition by a current mirror is not actually maintained to be regular due to an additional error caused by a manufacturing process. FIG. 3 illustrates a conceptual form of a current mirror circuit, and a relationship between a current flowing through the current mirror of FIG. 3 and an output voltage is as shown in Equation 1.

$$\frac{i_O}{i_I} = \frac{1 + \lambda v_{DS2}}{1 + \lambda v_{DS1}} \qquad \text{[Equation 1]}$$

In Equation 1, a λ value denotes a Channel Length Modulation Factor value associated with the additional error, and Equation 1 may correspond to an error relational expression associated with a difference between an error of the threshold voltage and an internal characteristic value of a transistor.

Figure 4:
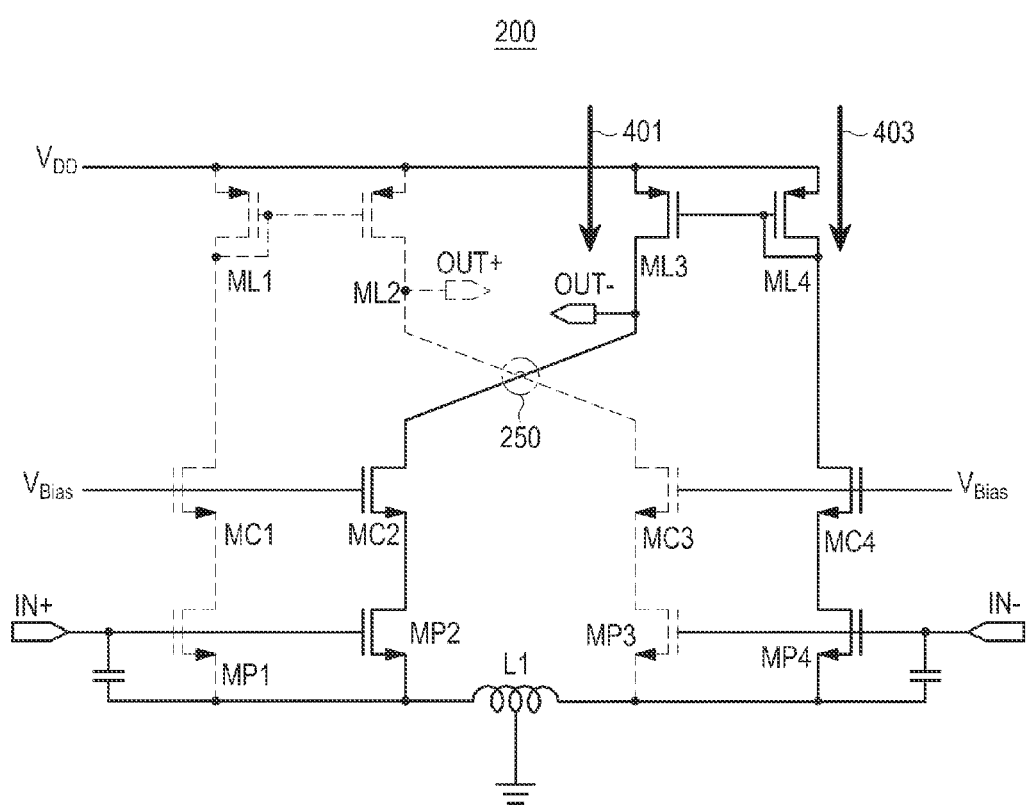
FIG. 4 is a diagram illustrating a current mirror having a cross structure, applied to the low noise amplifier of FIG. 2.

When the current mirror scheme in which current paths of the plus amplifying unit 210 and the minus amplifying unit 230 cross is applied as described in FIG. 2, an amount of the additional error actually generated in the current mirror is separated and thus, a mismatch in the low noise amplifier 200 may be effectively reduced. FIG. 4 is a diagram conceptually illustrating current paths 401 and 403 in a current mirror having a cross structure according to an embodiment of the present invention.

Figure 5:
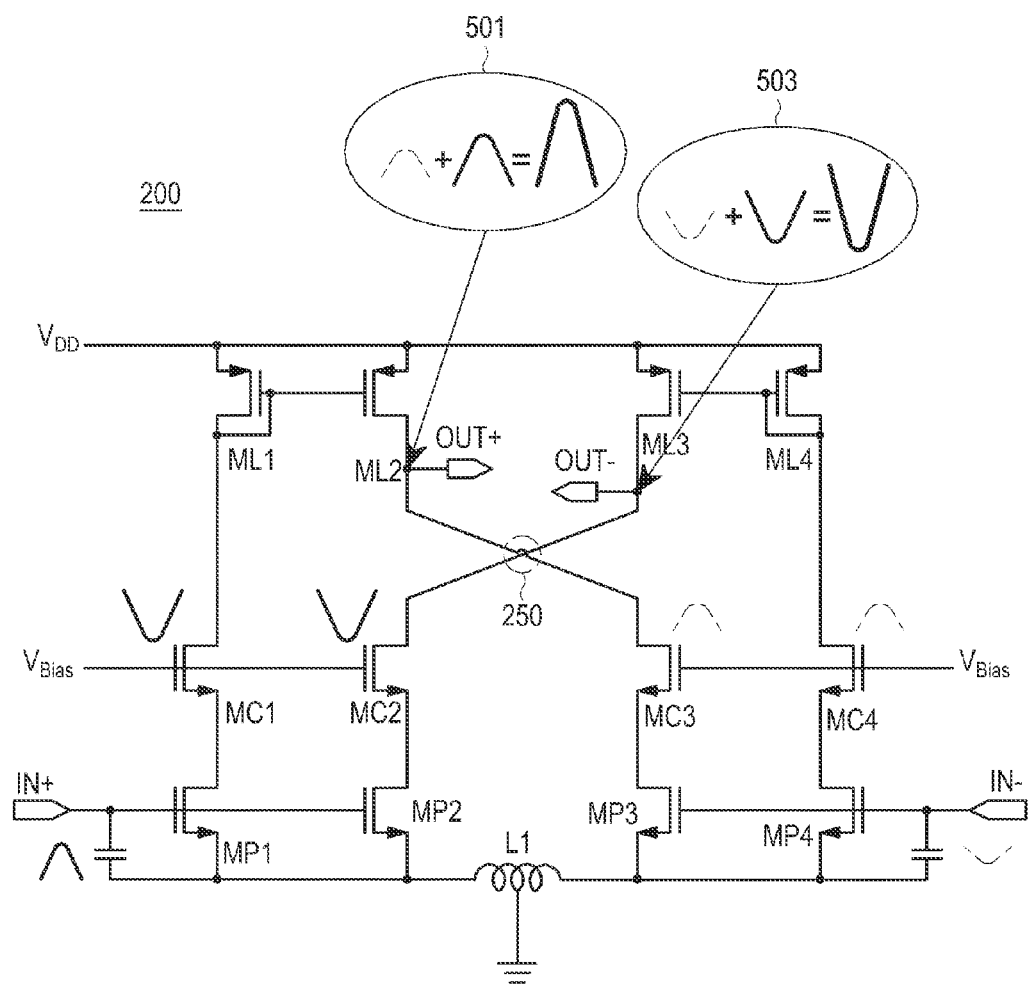
FIG. 5 is a diagram illustrating an operation of removing a mismatch in a low noise amplifier according to an embodiment of the present invention.

FIG. 5 is a diagram illustrating an operation of removing a mismatch in a low noise amplifier according to an embodiment of the present invention. FIG. 5 uses the same reference numeral (sign) for the same element as FIG. 2.

A transistor having a general common source structure amplifies a signal by inversing the signal. That is, a plus (+) input signal is applied to a gate of the transistor, a minus (−) output signal is output from a drain. When a signal flow of the low noise amplifier 200 according to an embodiment of the present invention is understood based on the above described principle with reference to FIG. 5, it is recognized that a plus (+) input signal input to the first plus amplifying unit 211 is inversed into a minus signal through an NMOS (MP1) provided in a common source structure. An output signal applied to a gate of a PMOS load formed of two PMOSs (ML1 and ML2) after obtaining an isolation characteristic of a reverse directional current through an NMOS (MC1) provided in a cascode structure having a current buffer form is inversed again into a plus (+) signal through the PMOS (ML2).

Simultaneously, a minus (−) input signal applied to the second minus amplifying unit 233 is inversed into a plus (+) signal through an NMOS (MP3) provided in a common source structure. The inversed plus (+) signal is buffered through an NMOS (MC3) provided in a cascode structure having a current buffer form and is amplified by being added to the plus (+) signal inversed by the PMOS (ML2), and may be output through an output end (OUT+).

In this manner, the input signal is separated into a plus signal and a minus signal, and the plus signal and the minus signal are amplified through independent paths, respectively, and half of the plus signal and half of the minus signal are added in the PMOS load which is a final output end. For example, when a case in which a minus input signal, which is a relatively larger signal than a plus input signal, is input to the low noise amplifier 200 is assumed as illustrated in FIG. 5, a minus input signal separated from an input signal is inversed and added to a plus signal in the output end of the low noise amplifier 200. Therefore, according to embodiments of the present invention, irrespective of a difference in sizes between the plus input signal and the minus input signal, a signal that has an average size by decreasing the difference in the sizes (that is, removing a mismatch) is output from the output end of the low noise amplifier 200 as illustrated in the diagrams 501 and 503 and thus, a mismatch in an input end of a receiver may be effectively removed.

Referring again to FIG. 1, another embodiment of the present invention will be described. The controller 100 of FIG. 1 determines whether an input signal corresponds to, for example, a wideband signal such as a 3G signal or a narrowband signal such as a 2G signal, and controls an operation of a low noise amplifier so as to distinctively perform interference cancellation based on the determined type of the input signal.

That is, according to another embodiment of the present invention, when the input signal corresponds to the wideband signal such as the 3G signal, the controller 100 of FIG. 1 controls a low noise amplifier to remove a mismatch in an input end of a receiver, so as to provide a high IIP2 performance. When the input signal corresponds to the narrowband signal such as the 2G signal, the controller 100 of FIG. 1 controls the low noise amplifier to distinctively perform interference cancellation based on a type of the input signal using an auxiliary path that provides a high linearity, so as to provide a high third-order input intercept point (IIP3) performance.

Here, the IIP3 indicates a power point, where the input signal and a tertiary intermodulation (IM3) distorted signal are expected to cross, viewed from an input end of the receiver, and is one of the parameters indicating a linearity of a circuit, like the above described IIP2. The IIP2 parameter and the IIP3 parameter secure a high linearity in a circuit of the receiver as the parameters have high values.

Figure 6:
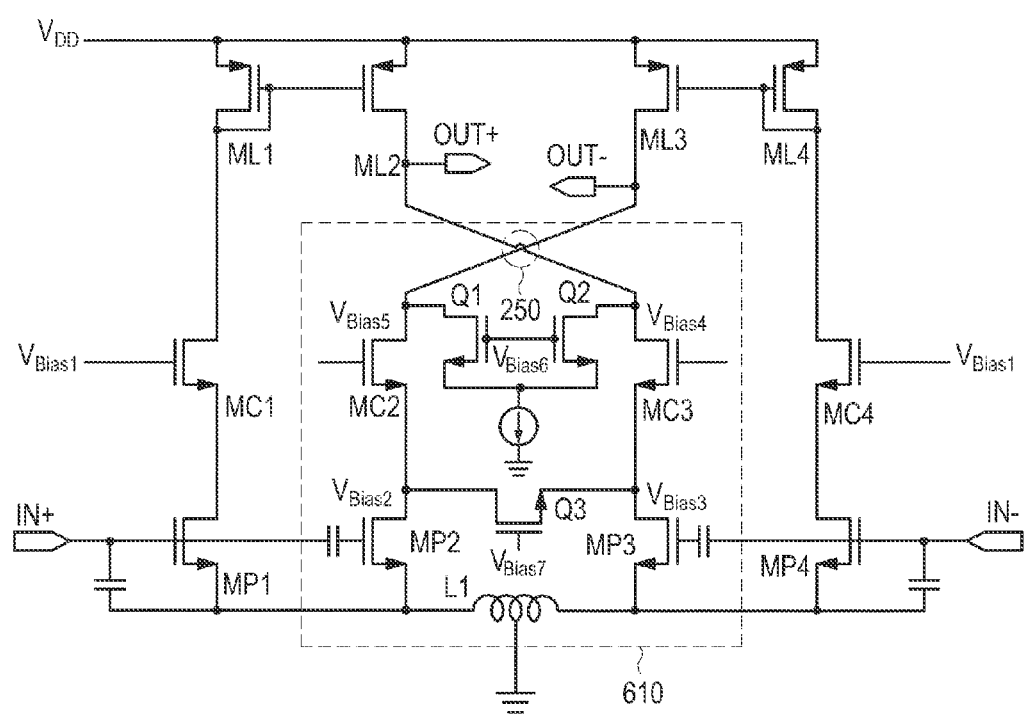
FIG. 6 is a circuit diagram illustrating a configuration of a low noise amplifier according to another embodiment of the present invention.

Also, FIG. 6 is a circuit diagram illustrating a configuration of a low noise amplifier according to another embodiment of the present invention. FIG. 6 uses the same reference numerals (signs) for the same elements as FIG. 2, and detailed descriptions for the same elements will be omitted.

Referring to FIG. 6, the low noise amplifier of FIG. 6 is an example of a low noise amplifier formed of a circuit having a high linearity in which an IIP3 parameter has a high value by adjusting a bias ($V_{Bias2}$ through $V_{Bias7}$) of a transistor (Q1, Q2, and Q3) provided in a cascode structure to have a high IIP3 parameter with respect to the auxiliary path, as opposed to removing a mismatch in the low noise amplifier. A narrowband signal such as a 2G signal is a small value within 200 KHz adjacent to a direct current and thus, an adjacent channel interference signal may be removed using a large capacitor. However, a size of the capacitor itself may be a problem when the capacitor is actually designed and thus, an additional circuit that provides a high linearity may be included the low noise amplifier in the embodiment of the present invention. The diagram 610 of FIG. 6 indicates the additional circuit included in the low noise amplifier to provide the high linearity. The additional circuit may provide a high linearity through an independent bias, and a publically known circuit may be used as the additional circuit.

Figure 7:
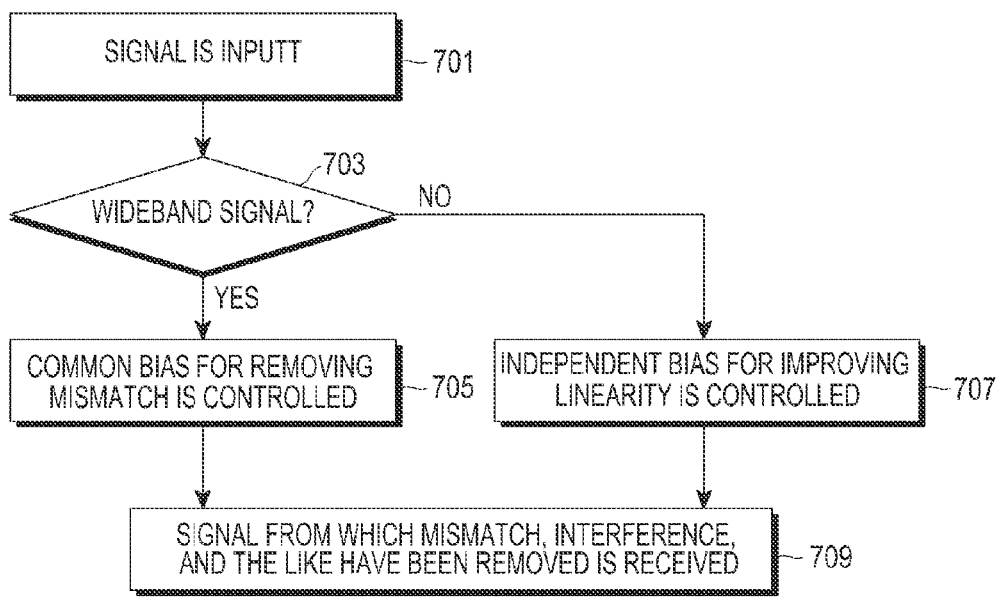
FIG. 7 is a flowchart illustrating a mismatch removing method that is performed in a receiver of a wireless communication system according to another embodiment of the present invention.

FIG. 7 is a flowchart illustrating a mismatch removing method that is performed in a receiver of a wireless communication system according to another embodiment of the present invention.

Referring to FIG. 7, when a wireless signal is input to a receiver in step S701, the controller determines whether the input signal corresponds to a wideband signal such as a 3G signal or a narrowband signal such as a 2G signal in step S703. The type of the signal may be determined based on, for example, whether the receiver operates in a 3G mode or a 2G mode.

When the result of the determination in step S703 indicates that the input signal corresponds to a wideband signal, the controller 100 proceeds with step S705 so as to control a common bias for removing a mismatch. Controlling of the common bias indicates providing a common bias to transistors to which biases are provided in a low noise amplifier. In step S705, the low noise amplifier of FIG. 6 removes a mismatch in the same manner as the low noise amplifier of FIG. 2.

When the result of the determination in step S703 indicates that the input signal corresponds to a narrowband signal, the controller 100 proceeds with step S707, and provides an independent bias to transistors in the additional circuit 610 of FIG. 6 for improving an IIP3 performance as opposed to removing a mismatch and thus, controls the low noise amplifier of FIG. 6 to operate as a high linearity circuit that cancels adjacent channel interference. In this example, controlling of an independent bias using an additional circuit may be based on a publically known technology and thus, detailed descriptions thereof will be omitted.

The receiver receives a signal from which a mismatch, an adjacent channel interference, and the like are removed based on the described operation, in step S709.

The invention claimed is:

1. A receiving method that removes a mismatch between current paths of a Low Noise Amplifier (LNA) in a wireless network, the method comprising:
   determining a type of an input signal received by the LNA through the wireless network;
   applying a common bias to transistors in the LNA when the type of the input signal is a wideband signal;
   applying the input signal to a current mirror in which a first current path of the LNA crosses a second current path of the LNA to remove the mismatch between the first current path and the second current path of the LNA; and
   outputting an output signal generated by the current mirror.

2. The method of claim 1, further comprising:
   applying an independent bias to each transistor in the LNA when the input signal corresponds to a narrowband signal.

3. The method of claim 1, wherein the mismatch includes at least one of a mismatch of the input signal and a mismatch due to a circuit of the LNA.

4. The method of claim 1, further comprising:
   secondarily removing the mismatch by controlling a resistance value of a trans-impedance amplifier that converts the output signal from which the mismatch is removed into a voltage signal.

5. The method of claim 1, wherein the outputting of the output signal comprises:
   receiving, by the LNA, the input signal by distinguishing a plus input signal and a minus input signal;
   amplifying the plus input signal and the minus input signal, respectively; and
   outputting the output signal from which the mismatch is removed by adding half of the amplified plus input signal and half of the amplified minus input signal,
   wherein the plus input signal is transmitted along one of the first current path of the LNA and the second current path of the LNA, and
   wherein the minus input signal is transmitted along another one of the first current path of the LNA and the second current path of the LNA.

6. A device for removing a mismatch between current paths of a Low Noise Amplifier (LNA) in a wireless network, the device comprising:
   the LNA configured to amplify an input signal, which is received by the LNA through the wireless network, using a current mirror included in the LNA, the current mirror configured to apply a current mirror scheme in which a first current path crosses a second current path to remove the mismatch between the first current path and the second current path of the LNA; and
   a controller configured to determine a type of the input signal, to apply the input signal to the current mirror, to apply a common bias to transistors in the LNA, and to control the LNA to output an output signal generated by the current mirror when the input signal is a wideband signal.

7. The device of claim 6, wherein the controller is further configured to apply an independent bias to each transistor in the LNA when the input signal corresponds to a narrowband signal.

8. The device of claim 7, wherein the LNA is further configured to comprise an additional circuit configured to increase a linearity of the LNA based on the independent bias.

9. The device of claim 6, wherein the mismatch includes at least one of a mismatch of the input signal and a mismatch due to a circuit of the LNA.

10. The device of claim 6, wherein the controller is further configured to control a resistance value of a trans-impedance amplifier configured to convert the output signal from which the mismatch is removed into a voltage signal, so as to secondarily remove the mismatch.

11. The device of claim 6, wherein the LNA is further configured to receive the input signal by distinguishing a plus input signal and a minus input signal, to amplify the plus input signal and the minus input signal, respectively, and to output the output signal from which the mismatch is removed by adding half of the amplified plus input signal and half of the amplified minus input signal,
   wherein the plus input signal is transmitted along one of the first current path of the LNA and the second current path of the LNA, and
   wherein the minus input signal is transmitted along another one of the first current path of the LNA and the second current path of the LNA.

12. A Low Noise Amplifier (LNA) of a wireless network, the LNA comprising:
   a plus amplifying unit configured to receive a plus input signal in a receiver and to amplify the received plus input signal; and
   a minus amplifying unit configured to receive a minus input signal in the receiver and to amplify the received minus input signal,
   wherein the plus amplifying unit and the minus amplifying unit form a current mirror in which a current path of the plus amplifying unit crosses a current path of the minus amplifying unit.

13. The LNA of claim 12, wherein each of the plus amplifying unit and the minus amplifying unit is configured to comprise a differential pair amplifier provided in an identical structure.

14. The LNA of claim 12, wherein the plus amplifying unit and the minus amplifying unit are configured to output an output signal from which a mismatch between the plus input signal and the minus input signal is removed by adding half of the amplified plus input signal and half of the amplified minus input signal through the current mirror in which the current path of the plus amplifying unit crosses the current path of the minus amplifying unit.

15. The LNA of claim 12, wherein the LNA is further configured to amplify and output a wideband input signal and a narrowband input signal through the same signal path.

* * * * *